(12) United States Patent
Nakamura et al.

(10) Patent No.: US 12,212,112 B2
(45) Date of Patent: Jan. 28, 2025

(54) DUAL OPTICAL FREQUENCY COMB LIGHT-EMITTING DEVICE

(71) Applicant: Panasonic Intellectual Property Management Co., Ltd., Osaka (JP)

(72) Inventors: Tasuku Nakamura, Osaka (JP); Yasuhisa Inada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 555 days.

(21) Appl. No.: 17/546,153

(22) Filed: Dec. 9, 2021

(65) Prior Publication Data

US 2022/0102930 A1    Mar. 31, 2022

Related U.S. Application Data

(63) Continuation of application No. PCT/JP2020/022657, filed on Jun. 9, 2020.

(30) Foreign Application Priority Data

Jul. 31, 2019 (JP) ................................. 2019-141179

(51) Int. Cl.
*G01J 3/02* (2006.01)
*G01J 3/10* (2006.01)
(Continued)

(52) U.S. Cl.
CPC .............. *H01S 3/086* (2013.01); *G01J 3/021* (2013.01); *G01J 3/10* (2013.01); *G01J 3/427* (2013.01);
(Continued)

(58) Field of Classification Search
CPC ... G01J 3/021; G01J 3/10; G01J 3/427; H01S 3/0078; H01S 3/0092; H01S 3/10092; H01S 3/2391; H01S 5/0078
See application file for complete search history.

(56) References Cited

U.S. PATENT DOCUMENTS

2003/0123780 A1*  7/2003  Fischer ................... G02F 1/035
                                                                  385/39
2007/0263681 A1   11/2007  Yoshitomi et al.
(Continued)

FOREIGN PATENT DOCUMENTS

JP      2003-156775      5/2003
JP      2007-306483     11/2007
(Continued)

OTHER PUBLICATIONS

Dutt, "Dual-comb Spectroscopy using On-chip Mode-locked Frequency Combs," 2017, CLEO, STh3L.2. (Year: 2017).*
(Continued)

*Primary Examiner* — Michael Carter
(74) *Attorney, Agent, or Firm* — Rimon P.C.

(57) ABSTRACT

A dual optical frequency comb light-emitting device includes a first optical-frequency-comb laser source that includes a first laser resonator having a first optical path length, a second optical-frequency-comb laser source that includes a second laser resonator having a second optical path length different from the first optical path length, and an optical coupler that causes a first portion of first optical-frequency-comb laser light emitted from the first laser resonator to enter the second laser resonator. The first optical-frequency-comb laser source outputs a second portion of the first optical-frequency-comb laser light to an outside. The second optical-frequency-comb laser source
(Continued)

outputs second optical-frequency-comb laser light emitted from the second laser resonator to the outside.

13 Claims, 10 Drawing Sheets

(51) Int. Cl.
| | |
|---|---|
| G01J 3/427 | (2006.01) |
| G01J 3/433 | (2006.01) |
| H01S 3/00 | (2006.01) |
| H01S 3/086 | (2006.01) |
| H01S 3/10 | (2006.01) |
| H01S 3/23 | (2006.01) |
| H01S 5/00 | (2006.01) |
| G01J 3/42 | (2006.01) |
| H01S 3/13 | (2006.01) |
| H01S 5/10 | (2021.01) |

(52) U.S. Cl.
CPC .......... *G01J 3/4338* (2013.01); *H01S 3/0078* (2013.01); *H01S 3/0092* (2013.01); *H01S 3/10092* (2013.01); *H01S 3/2391* (2013.01); *G01J 2003/423* (2013.01); *G01J 2003/4334* (2013.01); *H01S 3/1305* (2013.01); *H01S 5/0078* (2013.01); *H01S 5/1032* (2013.01)

(56) References Cited

U.S. PATENT DOCUMENTS

| | | | |
|---|---|---|---|
| 2014/0253915 A1* | 9/2014 | Ataie | G01M 11/338 |
| | | | 356/300 |
| 2018/0351319 A1* | 12/2018 | Koptyaev | H01S 5/005 |
| 2019/0252853 A1 | 8/2019 | Dhillon et al. | |
| 2020/0064708 A1* | 2/2020 | Diddams | H01S 3/2391 |

FOREIGN PATENT DOCUMENTS

| | | |
|---|---|---|
| JP | 2015-225328 | 12/2015 |
| JP | 2019-530987 | 10/2019 |
| WO | 2019/123719 | 6/2019 |

OTHER PUBLICATIONS

International Search Report of PCT application No. PCT/JP2020/022657 dated Sep. 1, 2020.
Nathalie Picque et al., "Frequency comb spectroscopy", Nature photonics, vol. 13, 2019, 146-157.
Ian Coddington et al., "Dual-comb spectroscopy", Optica vol. 3, No. 4, Apr. 2016, 414-426.
Alexander L. Gaeta et al., "Photonic-chip-based frequency combs", Nature photonics, vol. 13, 2019, 158-169.

* cited by examiner

DUAL OPTICAL FREQUENCY COMB LIGHT-EMITTING DEVICE

BACKGROUND

1. Technical Field

The present disclosure relates to dual optical frequency comb light-emitting devices.

2. Description of the Related Art

The characteristics related to the optical frequency of a target object can be studied by radiating light onto the target object and obtaining the frequency spectrum of the light transmitted through the target object or reflected by the target object. In the related art, a complex expensive device is used for obtaining the frequency spectrum of high-frequency light. However, with the optical frequency comb technology, an optical frequency spectrum can be obtained by using a simple inexpensive device. An optical frequency comb refers to a comb-like frequency spectrum formed of a plurality of discrete equally-spaced lines. In this description, laser light having an optical frequency comb will be referred to as "optical-frequency-comb laser light".

In recent years, an optical frequency spectrum can be obtained more easily in accordance with dual comb spectroscopy using two beams of optical-frequency-comb laser light having slightly different distances between the equally-spaced lines of the optical frequency combs (see, for example, N. Picque and T. W. Hansch, "Frequency Comb Spectroscopy", Nature Photonics 13, 146-157 (2019), I. Coddington, N. Newbury, and W. Swann, "Dual-Comb Spectroscopy", Optica 3, 414-426 (2019), and A. L. Gaeta, M. Lipson and T. J. Kippenberg, "Photonic-Chip-Based Frequency Combs", Nature Photonics 13, 158-169 (2019)). In dual comb spectroscopy, a target object is irradiated with interference light obtained as a result of superimposing these two beams of optical-frequency-comb laser light on each other, and a beat frequency spectrum of the interference light transmitted through the target object or reflected by the target object is obtained, so that the characteristics related to the optical frequency of the target object can be studied.

SUMMARY

One non-limiting and exemplary embodiment provides a dual optical frequency comb light-emitting device that synchronizes and stabilizes the operation of two optical-frequency-comb laser sources.

In one general aspect, the techniques disclosed here feature a dual optical frequency comb light-emitting device including a first optical-frequency-comb laser source that includes a first laser resonator having a first optical path length, a second optical-frequency-comb laser source that includes a second laser resonator having a second optical path length different from the first optical path length, and an optical coupler that causes a first portion of first optical-frequency-comb laser light emitted from the first laser resonator to enter the second laser resonator. The first optical-frequency-comb laser source outputs a second portion of the first optical-frequency-comb laser light to an outside. The second optical-frequency-comb laser source outputs second optical-frequency-comb laser light emitted from the second laser resonator to the outside.

With the technique according to the present disclosure, a dual optical frequency comb light-emitting device that synchronizes and stabilizes the operation of two optical-frequency-comb laser sources can be realized.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Optical-Frequency-Comb Laser Light and Dual Comb Spectroscopy

The basic principles of optical-frequency-comb laser light and dual comb spectroscopy will now be briefly described.

First, temporal changes in the electric field of optical-frequency-comb laser light and a frequency spectrum will be described with reference to FIGS. 7A and 7B.

Figure 7A:
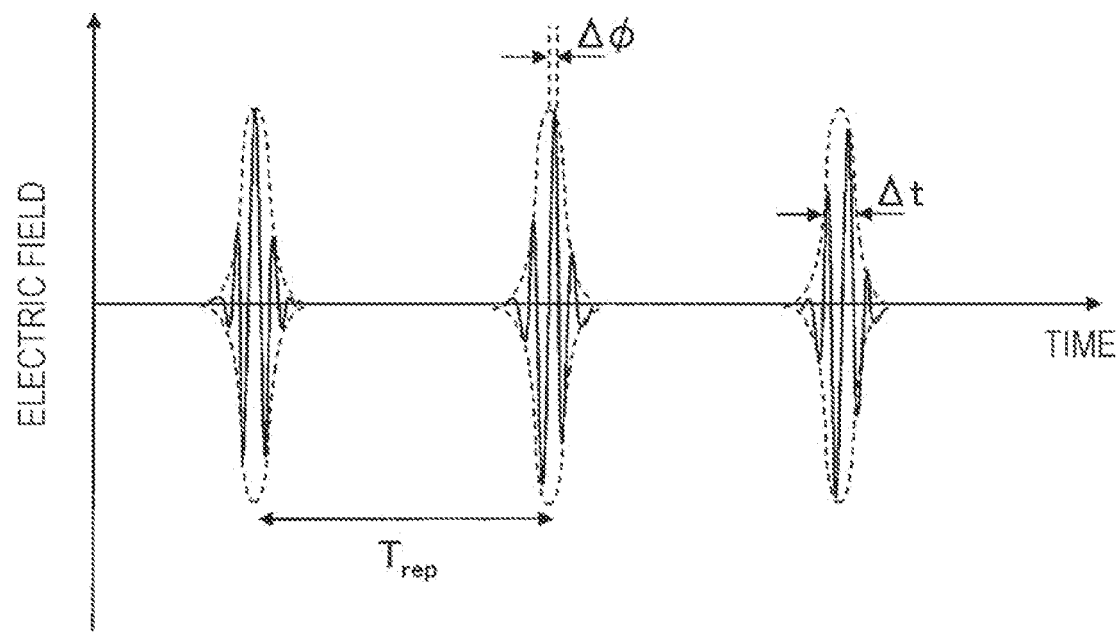
FIG. 7A schematically illustrates an example of temporal changes in an electric field of optical-frequency-comb laser light.

FIG. 7A schematically illustrates an example of temporal changes in the electric field of optical-frequency-comb laser light. As illustrated in FIG. 7A, optical-frequency-comb laser light is formed of an optical pulse train occurring in cyclic periods $T_{rep}$. A cyclic period $T_{rep}$ is, for example, longer than or equal to 100 ps and shorter than or equal to 100 ns. A full width at half maximum of each optical pulse is expressed by $\Delta t$. The full width $\Delta t$ at half maximum of each optical pulse is, for example, longer than or equal to 10 fs and shorter than or equal to 1 ps. An optical-frequency-comb laser source includes a laser resonator that emits optical-frequency-comb laser light by receiving excitation light or voltage. The laser resonator will be described in detail later. In the laser resonator, a group velocity $v_g$ at which an envelope of an optical pulse propagates and a phase velocity $v_p$ at which a wave in the optical pulse propagates differ from each other. When two neighboring optical pulses are superimposed such that the envelopes thereof coincide with each other due to the difference between the group velocity $v_g$ and the phase velocity $v_p$, the phases of the waves in these optical pulses shift by $\Delta\phi$. $\Delta\phi$ is smaller than $2\pi$. A cyclic period of the optical pulse train is expressed by $T_{rep}=L/v_g$, L being a round-trip length of the laser resonator.

Figure 7B:
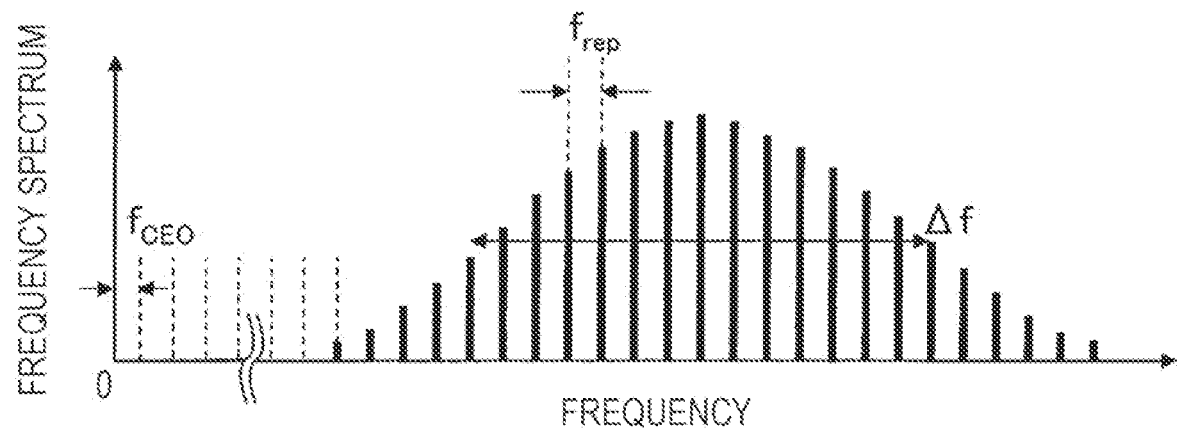
FIG. 7B schematically illustrates a frequency spectrum of optical-frequency-comb laser light.

FIG. 7B schematically illustrates a frequency spectrum of optical-frequency-comb laser light. As illustrated in FIG. 7B, the optical-frequency-comb laser light has a comb-like frequency spectrum formed of a plurality of discrete equally-spaced lines. A frequency of the plurality of discrete equally-spaced lines corresponds to a resonance frequency of the laser resonator in the longitudinal mode. A cyclic frequency corresponding to the distance between two neighboring equally-spaced lines in the optical frequency comb is expressed by $f_{rep}=1/T_{rep}$. The cyclic frequency $f_{rep}$ is, for example, higher than or equal to 10 MHz and lower than or equal to 10 GHz. When the round-trip length L of the laser resonator is equal to 30 cm and the group velocity $v_g$ is substantially equal to the speed of light in vacuum, the cyclic period $T_{rep}$ is equal to 1 ns, and the cyclic frequency $f_{rep}$ is equal to 1 GHz. A full width at half maximum of the optical frequency comb is expressed by $\Delta f=1/\Delta t$. The full width $\Delta f$ at half maximum of the optical frequency comb is, for example, greater than or equal to 1 THz and smaller than or equal to 100 THz. The frequency of the equally-spaced line located closest to the zero frequency assuming that the equally-spaced lines exist to near the zero frequency is referred to as a carrier-envelope offset frequency. A carrier-envelope offset frequency is expressed by $f_{CEO}=(\Delta\phi/(2\pi))f_{rep}$. The carrier-envelope offset frequency $f_{CEO}$ is lower than the cyclic frequency $f_{rep}$. Assuming that the carrier-envelope offset frequency $f_{CEO}$ is a 0-th mode frequency, an n-th mode frequency in the optical frequency comb is expressed by $f_n=f_{CEO}+nf_{rep}$. The electric field of the optical-frequency-comb laser light illustrated in FIG. 7A is expressed by $E(t)=\Sigma_n E_n \exp[-i(2\pi f_n t+\phi_n)]$, assuming that the amplitude and the phase of the electric field at the n-th mode frequency $f_n$ are defined as $E_n$ and $\phi_n$, respectively. The optical-frequency-comb laser light is mode-locked such that the phases at a plurality of mode frequencies are all the same.

The cyclic frequency $f_{rep}$ and the carrier-envelope offset frequency $f_{CEO}$ may slightly change due to disturbance, such as a vibration or a temperature change, relative to the optical-frequency-comb laser source. This is because a vibration causes the round-trip length L of the laser resonator to change, and a temperature change causes the group velocity $v_g$ and the phase velocity $v_p$ to change through a change in the refractive index of the laser resonator. The cyclic frequency $f_{rep}$ and the carrier-envelope offset frequency $f_{CEO}$ are much lower than the frequency of light. A slight change in the cyclic frequency $f_{rep}$ or the carrier-envelope offset frequency $f_{CEO}$ may have a specific effect on a mode frequency in the optical frequency comb. Therefore, an optical-frequency-comb laser source in the related art contains a modulation element for stabilizing the cyclic frequency $f_{rep}$ and the carrier-envelope offset frequency $f_{CEO}$. A modulation element includes, for example, a piezoelectric element, such as a piezo element, for suppressing a vibration, and a temperature adjustment element, such as a Peltier element, for suppressing a temperature change. The modulation element may be provided outside the optical-frequency-comb laser source. In order to stabilize the cyclic frequency $f_{rep}$, a portion of the optical-frequency-comb laser light is detected, and feedback is performed based on the detected portion such that the round-trip length L of the laser resonator becomes fixed by using the piezo element and the Peltier element. In order to stabilize the carrier-envelope offset frequency $f_{CEO}$, a portion of the optical-frequency-comb laser light is detected by using a nonlinear optical effect, and feedback is performed based on the detected portion such that the nonlinearity within the laser resonator becomes fixed by adjusting the intensity of excitation light input to the laser resonator.

Next, the principle of dual comb spectroscopy will be briefly described with reference to FIGS. 8A and 8B.

Figure 8A:
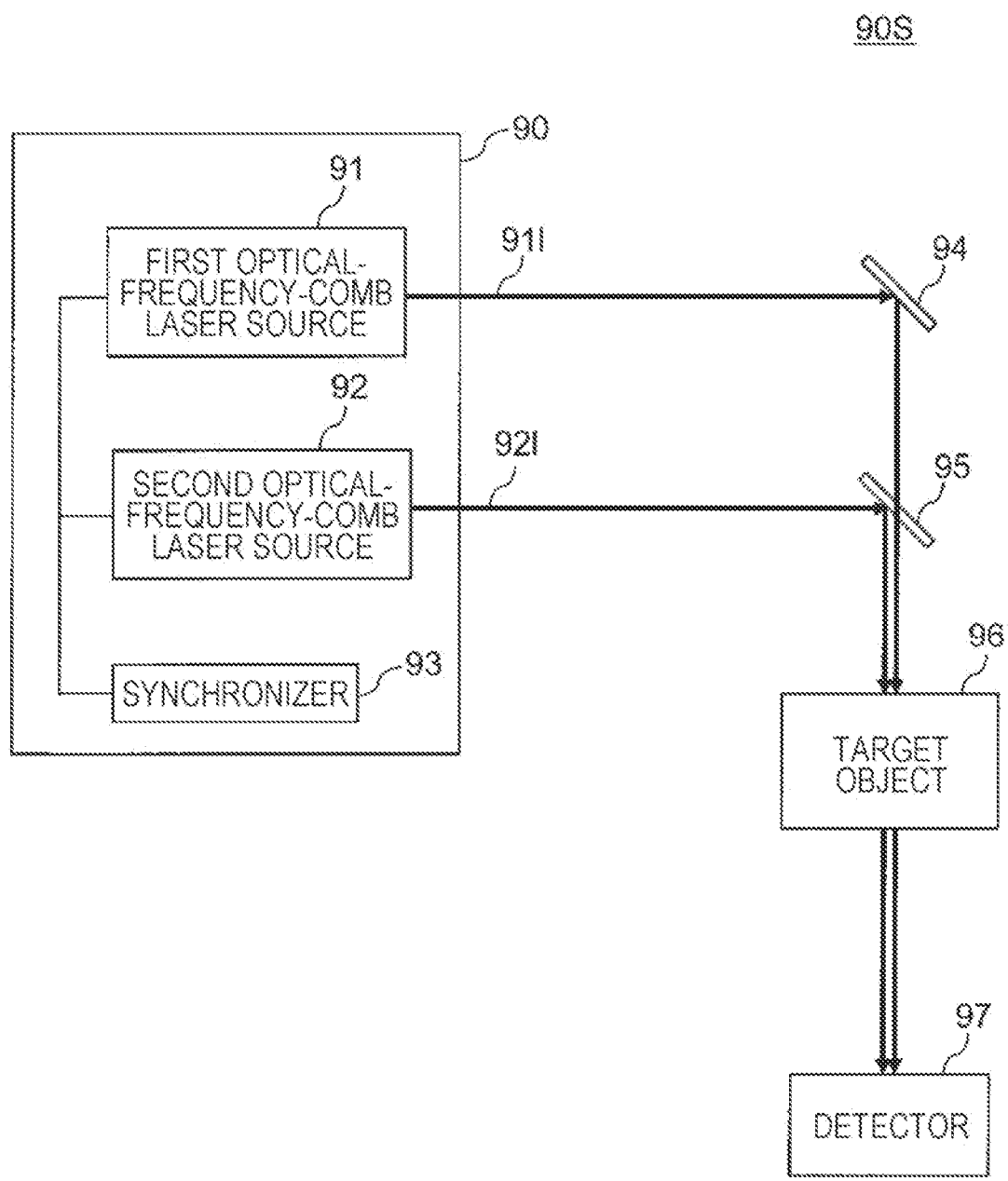
FIG. 8A schematically illustrates a spectroscopic system in dual comb spectroscopy.

FIG. 8A schematically illustrates a spectroscopic system 90S in dual comb spectroscopy. A conventional dual optical frequency comb light-emitting device 90 in the spectroscopic system 90S includes a first optical-frequency-comb laser source 91 that outputs first optical-frequency-comb laser light 91I, a second optical-frequency-comb laser source 92 that outputs second optical-frequency-comb laser light 92I, and a synchronizer 93 including a feedback mechanism that synchronizes and stabilizes the operation of the two laser sources.

The first optical-frequency-comb laser source 91 includes a first laser resonator (not illustrated) that emits the first optical-frequency-comb laser light 91I, and the second optical-frequency-comb laser source 92 includes a second laser resonator (not illustrated) that emits the second optical-frequency-comb laser light 92I. The first optical-frequency-comb laser light 91I has a first optical frequency comb whose n-th mode frequency is expressed by $f_{1n}=f_{CEO1}+nf_{rep1}$, and the second optical-frequency-comb laser light 92I has a second optical frequency comb whose n-th mode frequency is expressed by $f_{2n}=f_{CEO2}+nf_{rep2}$. $f_{CEO1}$ and $f_{CEO2}$ denote carrier envelope offset frequencies of the first optical frequency comb and the second optical frequency comb, respectively, and $f_{rep1}$ and $f_{rep2}$ denote cyclic frequencies of the first optical frequency comb and the second optical frequency comb, respectively. $f_{rep1}$ and $f_{rep2}$ are slightly different from each other, and the relationship $f_{rep2}=f_{rep1}+\delta f$ stands. $\delta f$ is much smaller than $f_{rep1}$. For example, $\delta f$ is greater than or equal to 0.1 kHz and smaller than or equal to 10 MHz.

In the example illustrated in FIG. 8A, the first optical-frequency-comb laser light 91I is reflected by a mirror 94, passes through a half mirror 95, and enters a target object 96. The second optical-frequency-comb laser light 92I is reflected by the half mirror 95 and enters the target object 96. Interference light obtained as a result of superimposing the first optical-frequency-comb laser light 91I and the second optical-frequency-comb laser light 92I on each other is radiated onto the target object 96, and the interference light transmitted through the target object 96 is detected by a detector 97. In the interference light, a beat is generated.

The target object 96 may be positioned in the optical path between the first optical-frequency-comb laser source 91 and the mirror 94 or in the optical path between the second optical-frequency-comb laser source 92 and the half mirror 95. In this case, the interference light of one of the first optical-frequency-comb laser light 91I and the second optical-frequency-comb laser light 92I that has been transmitted through the target object 96 and the other light not transmitted through the target object 96 is detected by the detector 97.

Figure 8B:
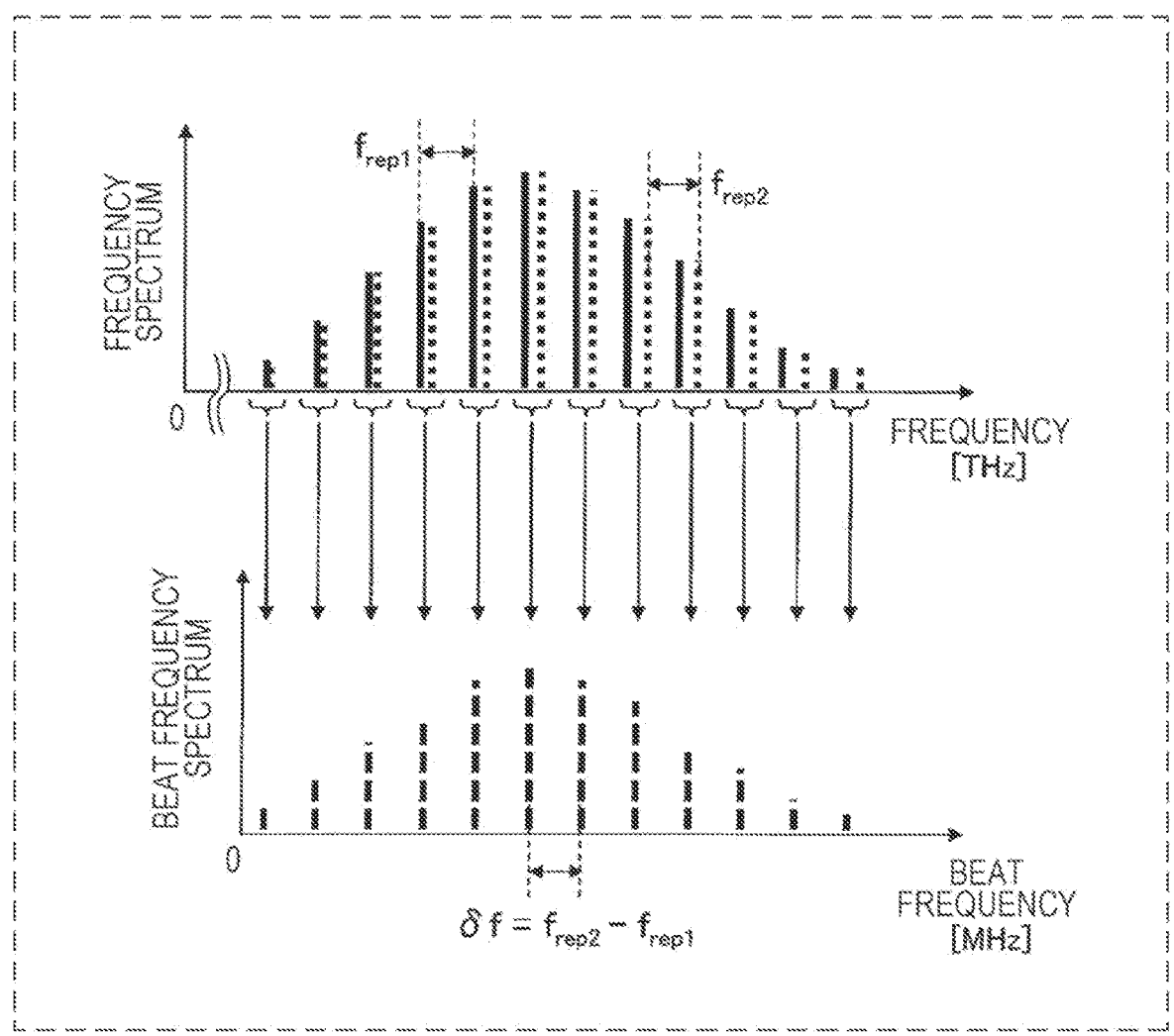
FIG. 8B is a diagram for explaining the principle of how an optical frequency spectrum is obtained in dual comb spectroscopy.

FIG. 8B is a diagram for explaining the principle of how an optical frequency spectrum is obtained in dual comb spectroscopy. The upper part of FIG. 8B schematically illustrates the spectra of the first optical frequency comb and the second optical frequency comb. The solid line indicates the first optical frequency comb, whereas the dashed line indicates the second optical frequency comb. The lower part of FIG. 8B schematically illustrates a beat frequency spectrum of the interference light. A difference between nearest mode frequencies in the first optical frequency comb and the second optical frequency comb corresponds to a beat frequency.

The characteristics related to the optical frequency of the target object 96 can be studied from the beat frequency spectrum. For example, it is possible to check how much light at what frequency has been absorbed by the target object 96. If one of the plurality of mode frequencies in the first optical frequency comb coincides with one of the plurality of mode frequencies in the second optical frequency comb, a zero beat frequency occurs. Accordingly, the characteristics related to the optical frequency of the target object 96 can be readily studied with reference to the coinciding mode frequencies.

Dual comb spectroscopy is advantageous in that information about light at a high frequency on the order of THz can be down-converted to information about a radio frequency on the order of MHz. A time waveform of a signal wave with a frequency on the order of GHz or lower can be detected by a common detector. However, detecting a time waveform of a signal wave with a frequency on the order of THz or higher by using a common detector is difficult. Therefore, in the related art, a signal wave with a frequency on the order of THz or higher is detected after being split based on frequencies by using, for example, a spectroscope. Since this frequency sweeping is time-consuming, an optical frequency spectrum cannot be obtained within a short period of time.

In dual comb spectroscopy, a time waveform of beats of a radio frequency can be detected by using a common detector. By Fourier-transforming this time waveform, a beat frequency spectrum as illustrated in the lower part of FIG. 8B can be obtained within a short period of time. Accordingly, a frequency spectrum of high-frequency light can be obtained within a short period of time.

On the other hand, the aforementioned synchronizer 93 may sometimes contain a complex expensive circuit.

By using a portion of the first optical-frequency-comb laser light emitted from the first laser resonator as excitation light for the second optical-frequency-comb laser light emitted from the second laser resonator, the synchronizer 93 can be omitted, so that a simple inexpensive dual optical frequency comb light-emitting device can be realized.

A dual optical frequency comb light-emitting device according to a first item includes a first optical-frequency-comb laser source that includes a first laser resonator having a first optical path length, a second optical-frequency-comb laser source that includes a second laser resonator having a second optical path length different from the first optical path length, and an optical coupler that causes a first portion of first optical-frequency-comb laser light emitted from the first laser resonator to enter the second laser resonator. The first optical-frequency-comb laser source outputs a second portion of the first optical-frequency-comb laser light to an outside. The second optical-frequency-comb laser source outputs second optical-frequency-comb laser light emitted from the second laser resonator to the outside.

In this dual optical frequency comb light-emitting device, the first portion of the first optical-frequency-comb laser light emitted from the first laser resonator is used as excitation light for the second optical-frequency-comb laser light emitted from the second laser resonator, so that the operation of the first optical-frequency-comb laser source and the operation of the second optical-frequency-comb laser source can be synchronized and stabilized.

According to a dual optical frequency comb light-emitting device according to a second item, in the dual optical frequency comb light-emitting device according to the first item, the optical coupler includes a filter that allows light in a certain frequency band to pass through. The optical coupler causes the first portion of the first optical-frequency-comb laser light to enter the second laser resonator via the filter.

In this dual optical frequency comb light-emitting device, the filter removes excess mode-frequency light from the first portion of the first optical-frequency-comb laser light, so that the operation of the second laser resonator can be stabilized.

According to a dual optical frequency comb light-emitting device according to a third item, in the dual optical frequency comb light-emitting device according to the second item, the frequency band includes a resonance frequency of the second laser resonator.

In this dual optical frequency comb light-emitting device, the second optical-frequency-comb laser light is emitted efficiently from the second laser resonator.

According to a dual optical frequency comb light-emitting device according to a fourth item, in the dual optical frequency comb light-emitting device according to any one of the first to third items, the first laser resonator includes a pair of first mirrors and a first gain medium positioned between the pair of first mirrors.

In this dual optical frequency comb light-emitting device, light stimulated-emitted from the first gain medium is reflected between the pair of first mirrors and is amplified as a result of passing through the first gain medium a number of times. As a result, the first optical-frequency-comb laser light is emitted from the first laser resonator.

According to a dual optical frequency comb light-emitting device according to a fifth item, in the dual optical frequency comb light-emitting device according to the fourth item, the first portion of the first optical-frequency-comb laser light is output from a first one of the pair of first mirrors, and the second portion of the first optical-frequency-comb laser light is output from a second one of the pair of first mirrors.

In this dual optical frequency comb light-emitting device, the optical coupler is provided at the side opposite the side where the second portion of the first optical-frequency-comb laser light is output to the outside.

According to a dual optical frequency comb light-emitting device according to a sixth item, in the dual optical frequency comb light-emitting device according to the fifth item, the first one of the pair of first mirrors has higher reflectivity than the second one.

In this dual optical frequency comb light-emitting device, the second portion of the first optical-frequency-comb laser light is efficiently output to the outside.

According to a dual optical frequency comb light-emitting device according to a seventh item, in the dual optical frequency comb light-emitting device according to the fourth item, the first portion and the second portion of the first optical-frequency-comb laser light are output from a first one of the pair of first mirrors.

In this dual optical frequency comb light-emitting device, the optical coupler is provided at the same side as the side where the second portion of the first optical-frequency-comb laser light is output to the outside.

According to a dual optical frequency comb light-emitting device according to an eighth item, in the dual optical frequency comb light-emitting device according to the seventh item, the first one of the pair of first mirrors has lower reflectivity than a second one of the pair of first mirrors.

In this dual optical frequency comb light-emitting device, the second portion of the first optical-frequency-comb laser light is efficiently output to the outside.

According to a dual optical frequency comb light-emitting device according to a ninth item, in the dual optical frequency comb light-emitting device according to any one of the fourth to eighth items, the first laser resonator further includes a first refractive-index modulator that modulates a refractive index of at least a part of an optical path between the pair of first mirrors.

In this dual optical frequency comb light-emitting device, the first refractive-index modulator can modulate a cyclic frequency of a first optical frequency comb.

According to a dual optical frequency comb light-emitting device according to a tenth item, in the dual optical frequency comb light-emitting device according to any one of the first to ninth items, the second laser resonator includes a pair of second mirrors and a second gain medium positioned between the pair of second mirrors.

In this dual optical frequency comb light-emitting device, light stimulated-emitted from the second gain medium is reflected between the pair of second mirrors and is amplified as a result of passing through the second gain medium a number of times. As a result, the second optical-frequency-comb laser light is emitted from the second laser resonator.

According to a dual optical frequency comb light-emitting device according to an eleventh item, in the dual optical frequency comb light-emitting device according to the tenth item, the second laser resonator further includes a second refractive-index modulator that modulates a refractive index of at least a part of an optical path between the pair of second mirrors.

In this dual optical frequency comb light-emitting device, the second refractive-index modulator can modulate a cyclic frequency of a second optical frequency comb.

According to a dual optical frequency comb light-emitting device according to a twelfth item, in the dual optical frequency comb light-emitting device according to any one of the first to ninth items, the second laser resonator includes a ring resonator composed of a nonlinear optical material.

In this dual optical frequency comb light-emitting device, the second optical-frequency-comb laser light is emitted from the ring resonator composed of the nonlinear optical material in accordance with four-wave mixing.

According to a dual optical frequency comb light-emitting device according to a thirteenth item, the dual optical frequency comb light-emitting device according to any one of the first to twelfth items further includes a substrate. The first optical-frequency-comb laser source, the second optical-frequency-comb laser source, and the optical coupler are integrated in a surface of the substrate.

This dual optical frequency comb light-emitting device is reduced in size as a result of the first optical-frequency-comb laser source, the second optical-frequency-comb laser source, and the optical coupler being integrated in the substrate.

In this disclosure, each circuit, unit, device, member, or section or each functional block in each block diagram may entirely or partially be implemented by, for example, one or more electronic circuits containing a semiconductor device, semiconductor integrated circuit (IC), or large scale integration (LSI). The LSI or the IC may be integrated in a single chip or may be configured by combining a plurality of chips. For example, the functional blocks excluding storage elements may be integrated in a single chip. Although the terms "LSI" and "IC" are used here, the terms used may change depending on the degree of integration, such that so-called "system LSI", "very large scale integration (VLSI)", or "ultra large scale integration (ULSI)" may be used. A field programmable gate array (FPGA) to be programmed after the LSI is manufactured, or a reconfigurable logic device that can reconfigure the connection relationship inside the LSI or can set up the circuit sections inside the LSI can also be used for the same purpose.

Furthermore, the function or operation of each circuit, unit, device, member, or section may entirely or partially be implemented by software processing. In this case, the software is stored in a non-transitory storage medium, such as one or more read-only memory (ROM) units, an optical disk, or a hard disk drive. When the software is executed by a processor, a function specified by the software is implemented by the processor and a peripheral device. A system or a device may include one or more non-transitory storage media storing the software, a processor, and a required hardware device, such as an interface.

In this disclosure, the term "light" refers not only to visible light (with a wavelength of about 400 nm to about 700 nm), but also to an electromagnetic wave containing an ultraviolet ray (with a wavelength of about 10 nm to about 400 nm) and an infrared ray (with a wavelength of about 700 nm to about 1 mm).

More specific embodiments of the disclosure will be described below. However, descriptions that are detailed more than necessary may sometimes be omitted. For example, detailed descriptions about already well-known matters and redundant descriptions with respect to substantially identical configurations may sometimes be omitted. This is to avoid unnecessary redundancy in the following description and to provide an easier understanding to skilled persons. The present inventors provide the appended drawings and the following description for allowing skilled persons to fully understand the disclosure but not for limiting the main subject described in the scope of the claims. In the following description, identical or similar components are given the same reference signs.

First Embodiment

Figure 1:
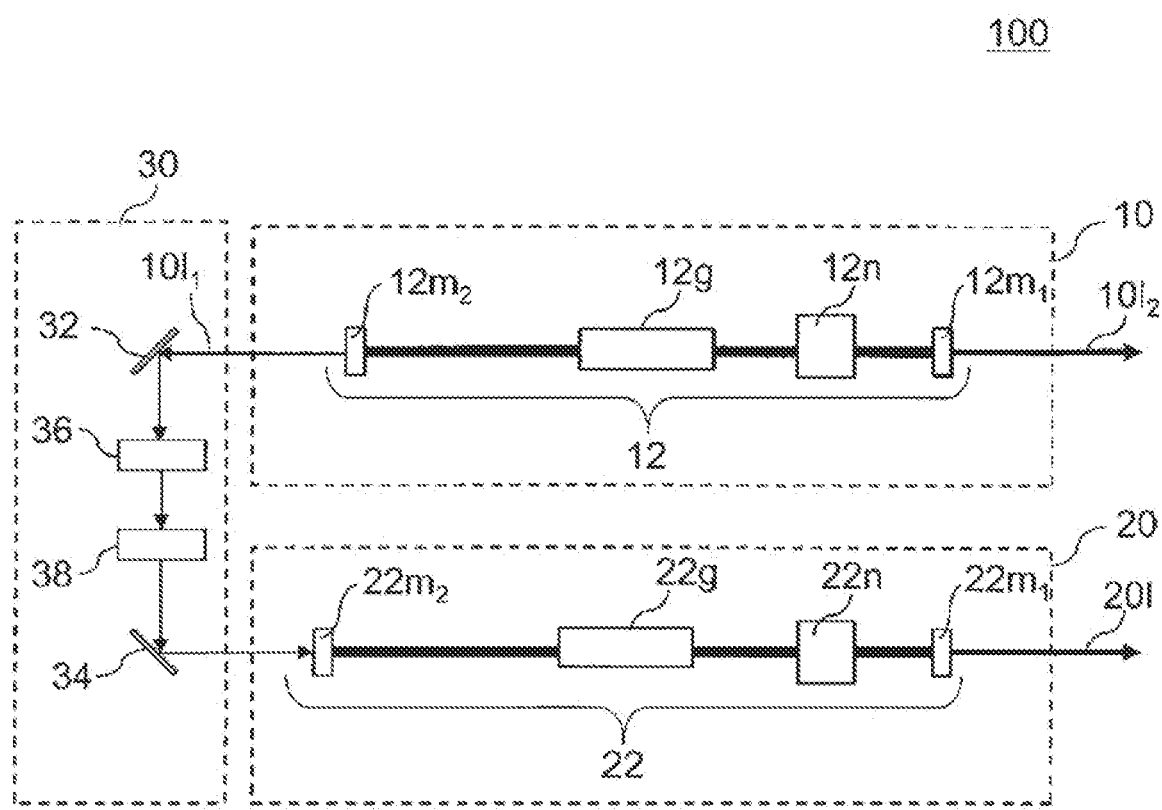
FIG. 1 schematically illustrates an example of a dual optical frequency comb light-emitting device according to a first embodiment of the disclosure.

First, a basic configuration example of a dual optical frequency comb light-emitting device according to a first embodiment of the disclosure will be described with reference to FIG. 1. FIG. 1 schematically illustrates an example of a dual optical frequency comb light-emitting device 100 according to the first embodiment of the disclosure. The dual optical frequency comb light-emitting device 100 includes a first optical-frequency-comb laser source 10, a second optical-frequency-comb laser source 20, and an optical coupler 30. In the following description, the first optical-frequency-comb laser source 10 will simply be referred to as "first laser source 10", the second optical-frequency-comb laser source 20 will simply be referred to as "second laser source 20", and the dual optical frequency comb light-emitting device 100 will simply be referred to as "light-emitting device 100".

The first laser source 10 includes a first laser resonator 12 having a first optical path length. An optical path length corresponds to the product of an actual distance and a refractive index. The first laser resonator 12 includes a mirror $12m_1$, a mirror $12m_2$, a first gain medium 12g, and a first refractive-index modulator 12n. The first gain medium 12g is positioned between the mirror $12m_1$ and the mirror $12m_2$. The first refractive-index modulator 12n modulates the refractive index of at least a part of the optical path between the mirror $12m_1$ and the mirror $12m_2$. The mirror $12m_1$ and the mirror $12m_2$ may sometimes be referred to as "a pair of first mirrors". The reflectivity of the mirror $12m_1$ is lower than the reflectivity of the mirror $12m_2$. The reflectivity of the mirror $12m_1$ is, for example, higher than or equal to 90% and lower than or equal to 95%. The reflectivity of the mirror $12m_2$ is, for example, higher than or equal to 95% and lower than or equal to 99%. However, the ranges are not limited these ranges.

The first gain medium 12g may contain at least one material selected from the group consisting of, for example, Ti:Al$_2$O$_3$, Yb:YAG, Yb:KYW, Yb:KY(WO$_4$)$_2$, Yb:Sr$_5$(PO$_4$)$_3$F, Yb:YVO$_4$, Yb:Sc$_2$O$_3$, Yb:Y$_2$O$_3$, Yb:Lu$_2$O$_3$, Er:YAG, Tm:YAG, Nd:YAG, Nd:YLF, Cr:YAG, Cr:forsterite, Cr:LiSGaF, Cr:LiSAF, Cr:LiCAF, Cr:ZnS, Cr:ZnSe, and Pr:YLF.

The first refractive-index modulator 12n may contain a material, such as a liquid crystal material, whose refractive index changes in response to voltage applied thereto or a temperature change. By using the first refractive-index modulator 12n to modulate the refractive index, the first optical path length of the first laser resonator can be changed. Accordingly, the first optical frequency comb can be adjusted. The first refractive-index modulator 12n may be provided depending on the intended purpose, or may be omitted.

The principle of how first optical-frequency-comb laser light is emitted from the first laser resonator 12 is as follows. When the first gain medium 12g is excited by, for example, continuous light from the outside or by receiving voltage, light is stimulated-emitted from the first gain medium 12g. This stimulated-emitted light is reflected repeatedly between the mirror $12m_1$ and the mirror $12m_2$, and is amplified as a result of passing through the first gain medium 12g a number of times. The amplified light is turned into a mode-locked optical pulse train by a supersaturated absorber (not illustrated) disposed between the mirror $12m_1$ and the mirror $12m_2$. The supersaturated absorber functions as an absorber against low-intensity light and functions as a transparent body against high-intensity light. Alternatively, without using a supersaturated absorber, for example, a mode-locked optical pulse train may be generated by a nonlinear optical effect, such as the Kerr lens effect, in the first gain medium 12g. In the Kerr lens effect, the light is self-focused in accordance with an increase in refractive index in the light propagating area. Accordingly, first optical-frequency-comb laser light is emitted from the first laser resonator 12.

The first laser source 10 outputs a first portion $10l_1$ of the first optical-frequency-comb laser light from the mirror $12m_2$ toward the optical coupler 30, and outputs a second portion $10l_2$ of the first optical-frequency-comb laser light from the mirror $12m_1$ to the outside.

The second laser source 20 includes a second laser resonator 22 having a second optical path length different from the first optical path length. The second laser resonator 22 includes a mirror $22m_1$, a mirror $22m_2$, a second gain medium 22g, and a second refractive-index modulator 22n. The second gain medium 22g is positioned between the mirror $22m_1$ and the mirror $22m_2$. The second refractive-index modulator 22n modulates the refractive index of at least a part of the optical path between the mirror $22m_1$ and the mirror $22m_2$. The mirror $22m_1$ and the mirror $22m_2$ may sometimes be referred to as "a pair of second mirrors". The reflectivity of the mirror $22m_1$ is lower than the reflectivity of the mirror $22m_2$. The reflectivity of the mirror $22m_1$ is, for example, higher than or equal to 90% and lower than or equal to 95%. The reflectivity of the mirror $22m_2$ is, for example, higher than or equal to 95% and lower than or equal to 99%. However, the ranges are not limited to these ranges. The second laser source 20 may have the same structure as the first laser source 10 except that the second optical path length is different from the first optical path length.

The first portion $10l_1$ of the first optical-frequency-comb laser light is input as excitation light to the second laser resonator 22 by the optical coupler 30. Consequently, second optical-frequency-comb laser light 20l is emitted from the second laser resonator 22. The second laser source 20 outputs the second optical-frequency-comb laser light 20l from the mirror $22m_1$ to the outside. Because the second optical path length is different from the first optical path length, the cyclic frequency $f_{rep2}$ of the second optical-frequency-comb laser light 20l is different from the cyclic frequency $f_{rep1}$ of the first optical-frequency-comb laser light.

The output intensity of the second optical-frequency-comb laser light 20l is lower than the output intensity of the second portion $10l_2$ of the first optical-frequency-comb laser light. Even if the two beams of laser light have different output intensities, a beat is still generated in the interference light of the two superimposed beams of laser light. As mentioned above, in dual comb spectroscopy, if a beat can be detected, the characteristics related to the optical frequency of the target object can be studied from the beat frequency. Therefore, the difference between the intensities of the two beams of laser light output from the light-emitting device 100 is not a problem.

As mentioned above, in the light-emitting device 100 according to this embodiment, the second optical-frequency-comb laser light 20l is emitted from the second laser resonator 22 by using the first portion $10l_1$ of the first optical-frequency-comb laser light as excitation light. Therefore, even when disturbance occurs in the light-emitting device 100, the second optical frequency comb fluctuates in a manner identical to or correlated to how the first optical frequency comb fluctuates. Specifically, even when disturbance occurs, a difference between a mode frequency in the first optical frequency comb and a mode frequency in the second optical frequency comb is less likely to change. Therefore, the light-emitting device 100 in this embodiment does not require the complex expensive synchronizer 93 in the conventional light-emitting device 90 illustrated in FIG. 8A. Accordingly, a simple inexpensive light-emitting device 100 can be realized.

Next, a configuration example of the optical coupler 30 will be described. The optical coupler 30 includes a mirror 32, a mirror 34, a filter 36, and a frequency shifter 38. The filter 36 and the frequency shifter 38 are positioned between the mirror 32 and the mirror 34. The first portion $10l_1$ of the first optical-frequency-comb laser light emitted from the first laser resonator 12 is transmitted through the mirror $12m_2$, is reflected by the mirror 32, passes through the filter 36 and the frequency shifter 38, is reflected by the mirror 34, and enters the second laser resonator 22 from the mirror $22m_2$. Accordingly, the optical coupler 30 causes the first portion $10l_1$ of the first optical-frequency-comb laser light to enter the second laser resonator 22 via the filter 36 and the frequency shifter 38. At least one of the filter 36 and the frequency shifter 38 may be omitted depending on the intended purpose.

Next, the functions of the filter 36 and the frequency shifter 38 in the optical coupler 30 will be described with reference to FIGS. 2A and 2B.

Figure 2A:
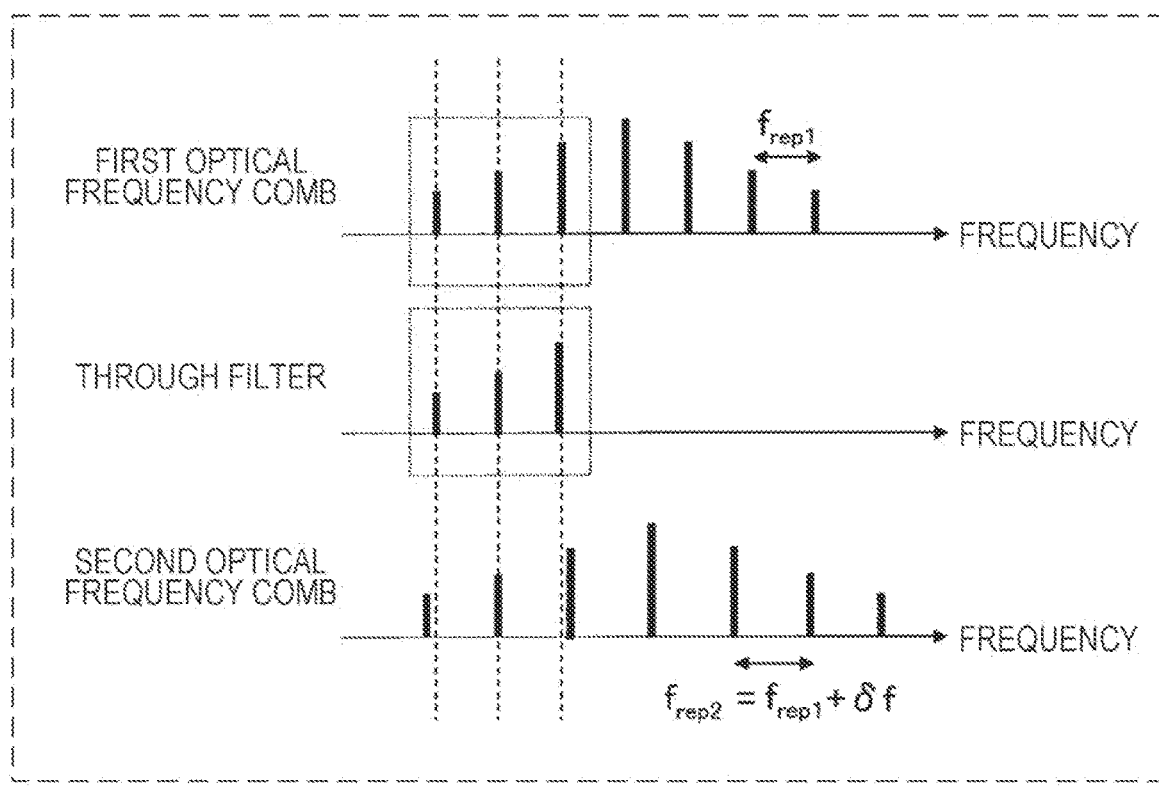
FIG. 2A is a diagram for explaining the function of a filter.

FIG. 2A is a diagram for explaining the function of the filter 36. In this example, the first optical frequency comb and the second optical frequency comb have mode frequencies that coincide with each other. In such a case, in the example illustrated in FIG. 2A, the frequency shifter 38 is not necessary. In FIG. 2A, the upper part schematically illustrates the spectrum of the first optical frequency comb. The middle part schematically illustrates the frequency spectrum of the first portion $10h$ of the first optical-frequency-comb laser light after passing through the filter 36. The lower part schematically illustrates the spectrum of the second optical frequency comb.

The filter 36 functions as a band-pass filter that allows light having one or more of the plurality of mode frequencies in the first optical frequency comb to pass through. In detail, the pass frequency band (indicated by a dotted frame in FIG. 2A) of the filter 36 includes a mode frequency, in the plurality of mode frequencies in the first optical frequency comb, coinciding with one of the plurality of mode frequencies in the second optical frequency comb. Specifically, this coinciding mode frequency corresponds to a resonance frequency of the second laser resonator 22.

In the example illustrated in FIG. 2A, only one of the mode frequencies in the first optical frequency comb coincides with one of the mode frequencies in the second optical frequency comb. The filter 36 in this example is designed to allow light having this coinciding mode frequency and two mode frequencies closest thereto to pass through. If a difference $\delta f$ ($=f_{rep2}-f_{rep1}$) between the cyclic frequency in the first optical frequency comb and the cyclic frequency in the second optical frequency comb are sufficiently small, a single coinciding frequency can be achieved. When light having this coinciding mode frequency is input to the second laser resonator 22, the second optical-frequency-comb laser light $20l$ is emitted using the light as excitation light. The two mode frequencies closest to the aforementioned mode frequency do not coincide with any of the plurality of mode frequencies in the second optical frequency comb. Therefore, light having each of these two mode frequencies does not contribute to the generation of the second optical frequency comb. The filter 36 may be designed to only allow light having a mode frequency that coincides with the resonance frequency of the second laser resonator 22 to pass through. If excess mode-frequency light is input to the second laser resonator 22, the operation of the second laser resonator 22 may possibly become unstable due to a nonlinear optical effect. The filter 36 removes the excess mode-frequency light so that the operation of the second laser resonator 22 can be stabilized.

Figure 2B:
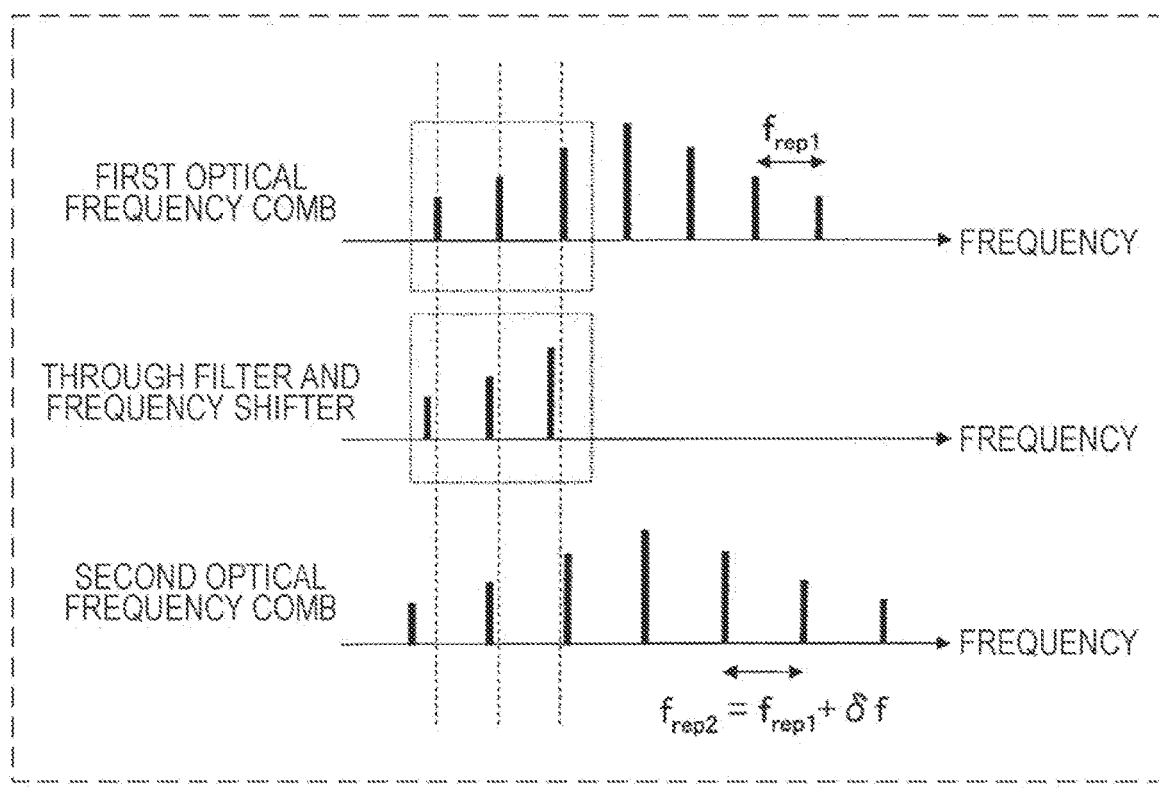
FIG. 2B is a diagram for explaining the functions of the filter and a frequency shifter.

FIG. 2B is a diagram for explaining the functions of the filter 36 and the frequency shifter 38. In this example, the first optical frequency comb and the second optical frequency comb do not have coinciding mode frequencies. In FIG. 2B, the upper part schematically illustrates the spectrum of the first optical frequency comb. The middle part schematically illustrates the frequency spectrum of the first portion $10h$ of the first optical-frequency-comb laser light after passing through the filter 36 and the frequency shifter 38. The lower part schematically illustrates the spectrum of the second optical frequency comb.

The frequency shifter 38 shifts the plurality of mode frequencies in the first optical frequency comb such that at least one of the plurality of mode frequencies in the first optical frequency comb coincides with at least one of the plurality of mode frequencies in the second optical frequency comb. The frequency shifter 38 includes, for example, an acousto-optic element. In the example illustrated in FIG. 2B, one of the shifted mode frequencies in the first optical frequency comb coincides with one of the mode frequencies in the second optical frequency comb. The filter 36 allows light having this coinciding mode frequency and two mode frequencies closest thereto to pass through. The example illustrated in FIG. 2B is similar to the example illustrated in FIG. 2A in that the light having this coinciding mode frequency is input to the second laser resonator 22. The second optical-frequency-comb laser light is emitted using the light as excitation light.

Modification of First Embodiment

Figure 3:
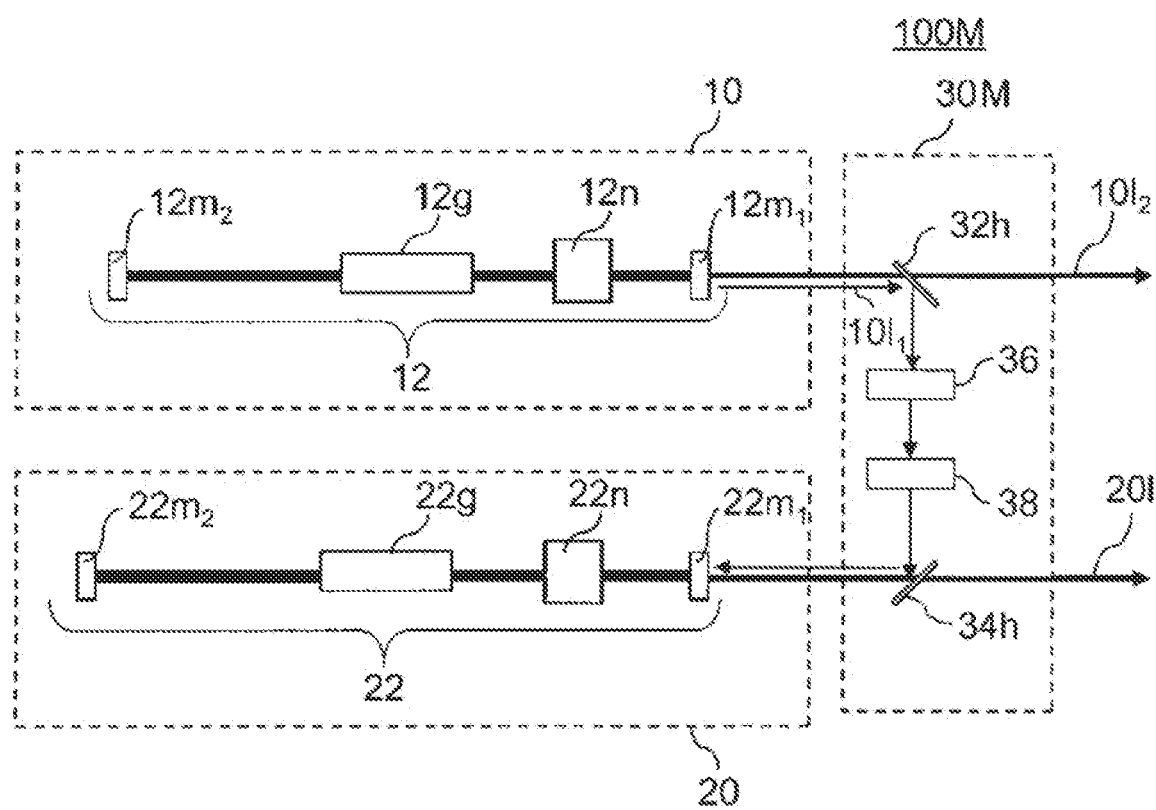
FIG. 3 schematically illustrates an example of a dual optical frequency comb light-emitting device according to a modification of the first embodiment.

Next, a modification of the light-emitting device 100 according to the first embodiment will be described with reference to FIG. 3. FIG. 3 schematically illustrates an example of a light-emitting device 100M according to the modification of the first embodiment. In the example illustrated in FIG. 3, an optical coupler 30M is positioned at the front side of the mirror $12m_1$ and the mirror $22m_1$. The optical coupler 30M includes a half mirror $32h$, a half mirror $34h$, the filter 36, and the frequency shifter 38. The filter 36 and the frequency shifter 38 are positioned between the half mirror $32h$ and the half mirror $34h$. The filter 36 and the frequency shifter 38 in the optical coupler 30M are the same as those described above with reference to FIGS. 2A and 2B.

The first portion $10l_1$ of the first optical-frequency-comb laser light emitted from the first laser resonator 12 is transmitted through the mirror $12m_1$, is reflected by the half mirror $32h$, passes through the filter 36 and the frequency shifter 38, is reflected by the half mirror $34h$, and enters the second laser resonator 22 from the mirror $22m_1$. Accordingly, the optical coupler 30M causes the first portion $10l_1$ of the first optical-frequency-comb laser light to enter the second laser resonator 22 via the filter 36 and the frequency shifter 38.

In the light-emitting device 100M according to this modification, the reflectivity of the mirror $12m_1$ in the first laser source 10 and the reflectivity of the mirror $22m_1$ in the second laser source 20 may be, for example, higher than or equal to 90% and lower than or equal to 95%. The reflectivity of the mirror $12m_2$ in the first laser source 10 and the reflectivity of the mirror $22m_2$ in the second laser source 20 may be, for example, higher than or equal to 95% and lower than or equal to 99.9%. However, the ranges are not limited to these ranges. Because the mirror $12m_2$ in the first laser source 10 and the mirror $22m_2$ in the second laser source 20 do not need to allow light to be transmitted therethrough, these mirrors may have high reflectivity close to 100%. The configurations of the first laser source 10 and the second laser source 20 other than the mirrors are the same as those described above.

The first laser source 10 outputs the first portion $10l_1$ of the first optical-frequency-comb laser light toward the optical coupler 30 from the mirror $12m_1$. On the other hand, the first laser source 10 outputs the second portion $10l_2$ of the first optical-frequency-comb laser light from the mirror $12m_1$ to the outside via the half mirror $32h$ in the optical coupler 30. The second laser source 20 outputs the second optical-frequency-comb laser light $20l$ from the mirror $22m_1$ to the outside via the half mirror $34h$.

A portion of the second optical-frequency-comb laser light 20*l* may be reflected by the half mirror 34*h* and the half mirror 32*h* and be input as feedback light to the first laser resonator 12. The feedback light may possibly make the operation of the first laser resonator 12 unstable. In order to remove the feedback light, the optical coupler 30M may further include an isolator (not illustrated) in the optical path.

The light-emitting device 100M according to the modification of the first embodiment similarly does not require a synchronizer. Accordingly, a simple inexpensive light-emitting device 100M can be achieved.

Second Embodiment

Figure 4:
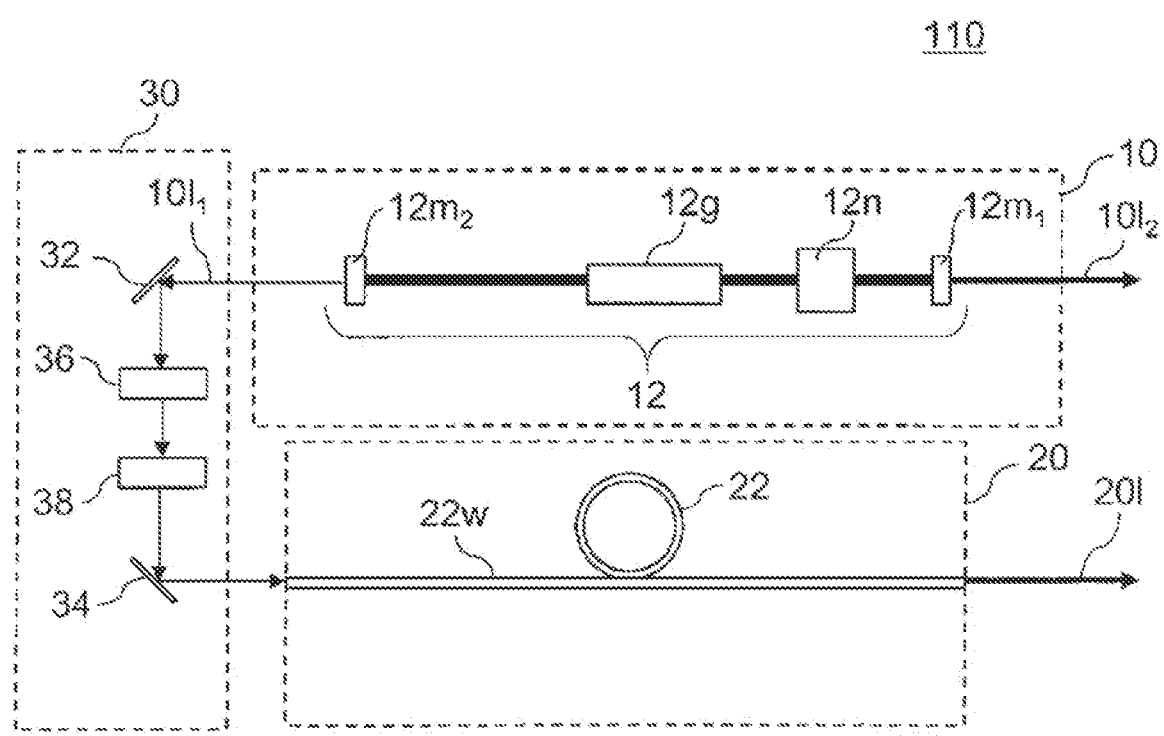
FIG. 4 schematically illustrates an example of a dual optical frequency comb light-emitting device according to a second embodiment of the disclosure.

Next, a basic configuration example of a light-emitting device according to a second embodiment of the disclosure will be described with reference to FIG. 4. In the following, descriptions redundant with the above description may sometimes be omitted. FIG. 4 schematically illustrates an example of a light-emitting device 110 according to the second embodiment of the disclosure. The light-emitting device 110 according to the second embodiment is different from the light-emitting device 100 according to the first embodiment in terms of the structure of the second laser source 20. In the light-emitting device 110 according to the second embodiment, the second laser source 20 includes an optical waveguide 22*w* and the second laser resonator 22 adjacent to the optical waveguide 22*w*. The second laser resonator 22 is a ring resonator composed of a nonlinear optical material. The first portion 10$l_1$ of the first optical-frequency-comb laser light is input to the ring resonator 22 via the optical waveguide 22*w* by the optical coupler 30. As a result, the second optical-frequency-comb laser light 20*l* is emitted from the ring resonator 22.

Next, the principle of how the second optical-frequency-comb laser light 20*l* is emitted from the ring resonator 22 will be described with reference to FIGS. 5A and 5B.

Figure 5A:
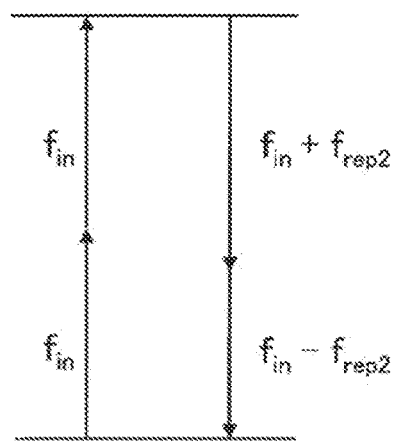
FIG. 5A schematically illustrates an energy transition process in a case where light with a specific frequency is input to a ring resonator.

FIG. 5A schematically illustrates an energy transition process in a case where light with a frequency $f_{in}$ is input to the ring resonator 22. The frequency $f_{in}$ is one of a plurality of mode frequencies respectively corresponding to a plurality of standing waves formed in the ring resonator 22. The transition process illustrated in FIG. 5A is caused by four-wave mixing in a nonlinear optical effect. The nonlinear optical effect causes an imaginary frequency $2f_{in}$ to transition from a base level to an excited level. Subsequently, in the transition from the excited level to the base level, light with a frequency $f_{in} \pm f_{rep2}$ is output. In the transition process illustrated in FIG. 5A, the output energy is equal to the input energy. The cyclic frequency $f_{rep2}$ of the second optical frequency comb corresponds to a difference between two mode frequencies that are closest to each other among the aforementioned plurality of mode frequencies in the ring resonator 22.

Figure 5B:
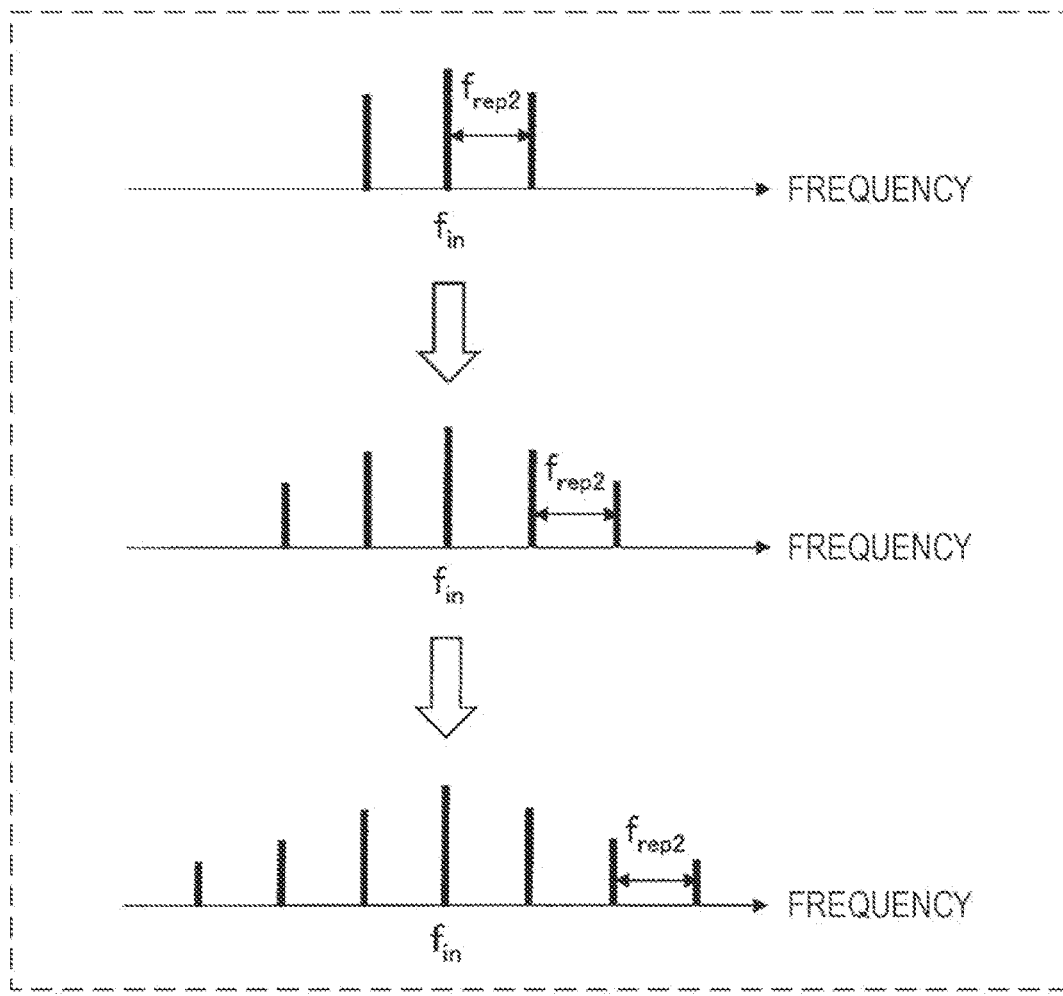
FIG. 5B schematically illustrates a process of how a second optical frequency comb is formed.

FIG. 5B schematically illustrates a process of how the second optical frequency comb is formed. As illustrated in the upper part of FIG. 5B, the frequency $f_{in} \pm f_{rep2}$ occurs from the frequency $f_{in}$ in accordance with the transition process illustrated in FIG. 5A. Likewise, as illustrated in the middle part of FIG. 5B, the frequency $f_{in}$ and a frequency $f_{in} \pm 2f_{rep2}$ occur from the frequency $f_{in} \pm f_{rep2}$. Similarly, as illustrated in the lower part of FIG. 5B, the frequency $f_{in} \pm f_{rep2}$ and a frequency $f_{in} \pm 3f_{rep2}$ occur from the frequency $f_{in} \pm 2f_{rep2}$. By repeating this process, the second optical frequency comb is formed.

The cyclic frequency $f_{rep2}$ of the second optical frequency comb is inversely proportional to the optical path length of the ring resonator 22. The optical path length of the ring resonator 22 can be adjusted by changing the refractive index of the ring resonator 22 in accordance with a temperature change or by expanding and contracting the ring resonator 22. Therefore, by incorporating a temperature adjustment element into the ring resonator 22, the cyclic frequency $f_{rep2}$ of the second optical frequency comb can be adjusted by the temperature adjustment element.

The first laser source 10 outputs the second portion 10$l_2$ of the first optical-frequency-comb laser light from the mirror 12$m_1$ to the outside. The second laser source 20 outputs the second optical-frequency-comb laser light 20*l* to the outside via the optical waveguide 22*w*.

The light-emitting device 110 according to this embodiment similarly does not require a synchronizer. Accordingly, a simple inexpensive light-emitting device 110 can be achieved. Even in a case where the first optical frequency comb and the second optical frequency comb are obtained based on different principles, as in this embodiment, advantages similar to those in the first embodiment can be achieved. The light-emitting device 110 may alternatively include the optical coupler 30M according to the modification of the first embodiment in place of the optical coupler 30.

Third Embodiment

Next, a basic configuration example of a light-emitting device according to a third embodiment of the disclosure will be described with reference to FIGS. 6A and 6B. The light-emitting device according to each of the above embodiments can be mounted and integrated in a substrate. The following description relates to features different from those of the above embodiments.

Figure 6A:
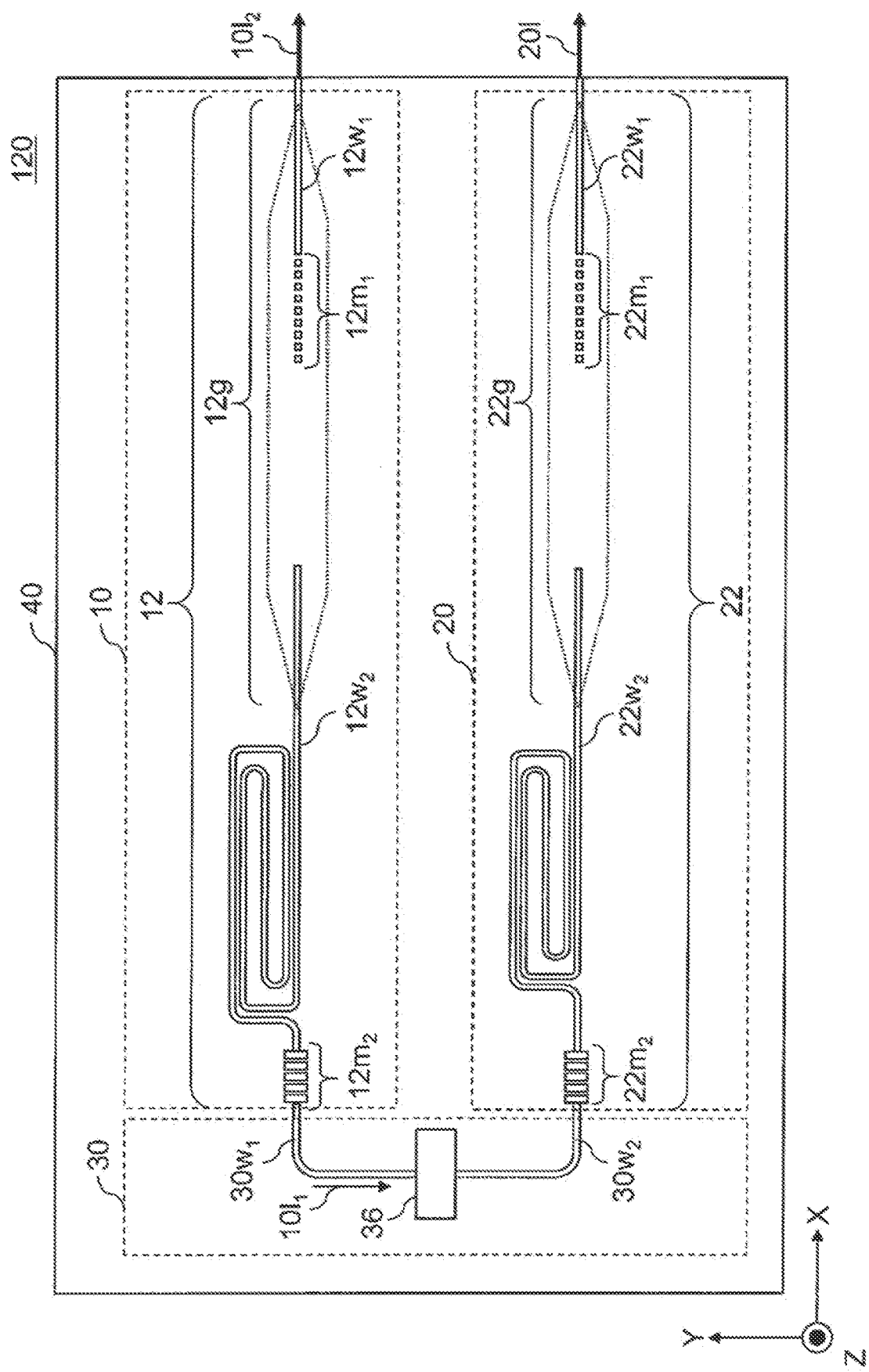
FIG. 6A is a top view schematically illustrating an example of a dual optical frequency comb light-emitting device according to a third embodiment of the disclosure.

FIG. 6A is a top view schematically illustrating an example of a light-emitting device 120 according to the third embodiment of the disclosure. FIG. 6B is a cross-sectional view taken along an XZ plane, schematically illustrating the first laser source 10 in the light-emitting device 120 illustrated in FIG. 6A. The light-emitting device 120 according to this embodiment includes a substrate 40, the first laser source 10, the second laser source 20, and the optical coupler 30 that are integrated in the surface of the substrate 40, and a protection layer 50, such as a polymer, covering the first laser source 10, the second laser source 20, and the optical coupler 30. In FIG. 6A, the protection layer 50 is not illustrated. Similar to the light-emitting device 100 according to the first embodiment, the light-emitting device 120 according to this embodiment may further include the first refractive-index modulator 12*n*, the second refractive-index modulator 22*n*, and the frequency shifter 38. For reference, X, Y, and Z axes that are orthogonal to one another are schematically illustrated. For the sake of convenience, the direction in which the Z value increases will be referred to as "upward". This is not intended to limit the orientation of the light-emitting device 120 when being used. The light-emitting device 120 may be used in any orientation.

The surface of the substrate 40 in the illustrated example is parallel to the XY plane. For example, the substrate 40 may have a multilayer structure obtained by stacking a high refractive-index layer 40*a* of, for example, Si and a low refractive-index layer 40*b* of, for example, $SiO_2$ in this order in the Z direction. The substrate 40 does not have to include the high refractive-index layer 40*a*.

The first laser source 10 includes the first laser resonator 12 having the first optical path length. The first laser resonator 12 includes the mirror $12m_1$, the mirror $12m_2$, the first gain medium $12g$, an optical waveguide $12w_1$, and an optical waveguide $12w_2$. The first gain medium $12g$ is partially positioned between the mirror $12m_1$ and the mirror $12m_2$ in plan view. The optical waveguide $12w_1$ is connected to the mirror $12m_1$. The optical waveguide $12w_2$ is positioned between the mirror $12m_2$ and the first gain medium $12g$.

Likewise, the second laser source 20 includes the second laser resonator 22 having the second optical path length different from the first optical path length. The second laser resonator 22 includes the mirror $22m_1$, the mirror $22m_2$, the second gain medium $22g$, an optical waveguide $22w_1$, and an optical waveguide $22w_2$. The second gain medium $22g$ is partially positioned between the mirror $22m_1$ and the mirror $22m_2$. The optical waveguide $22w_1$ is connected to the mirror $22m_1$. The optical waveguide $22w_2$ is positioned between the mirror $22m_2$ and the second gain medium $22g$.

In the example illustrated in FIG. 6A, the first gain medium $12g$ in the first laser resonator 12 and the second gain medium $22g$ in the second laser resonator 22 are indicated with dotted lines. The first laser resonator 12 and the second laser resonator 22 have identical structures except for different optical path lengths.

Figure 6B:
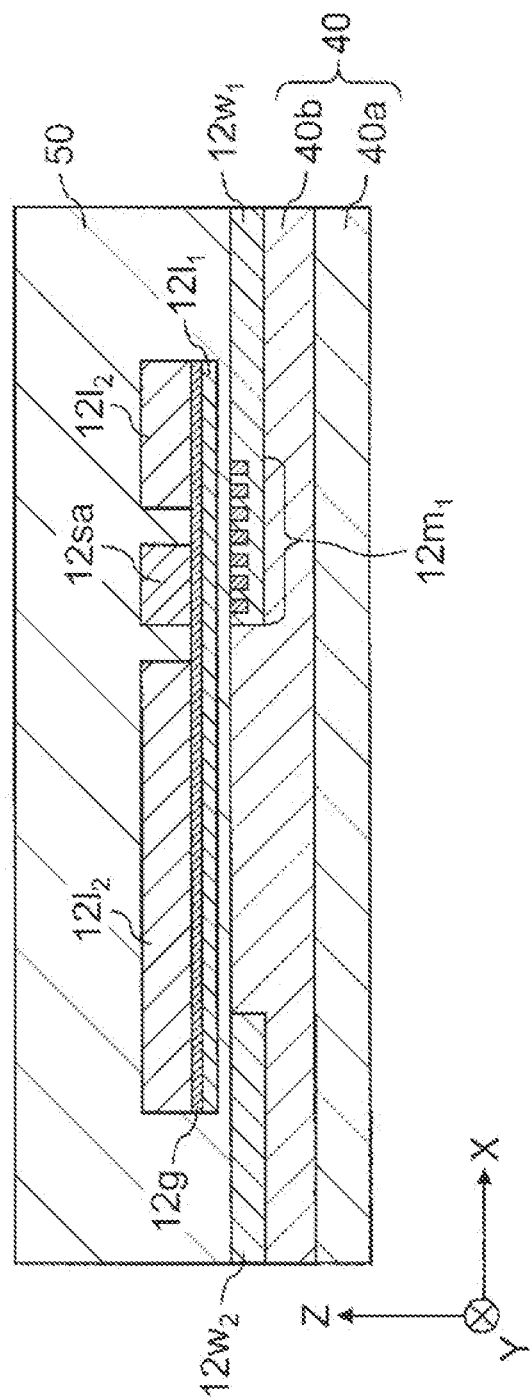
FIG. 6B is a cross-sectional view taken along an XZ plane, schematically illustrating a first laser source in the dual optical frequency comb light-emitting device illustrated in FIG. 6A.

In the example illustrated in FIG. 6B, the optical waveguide $12w_1$ in the first laser resonator 12 is embedded in the low refractive-index layer $40b$ of the substrate 40. The optical waveguide $12w_1$ may alternatively be provided on the low refractive-index layer $40b$. The optical waveguide $12w_1$ may be composed of at least one high refractive-index material selected from the group consisting of Si and SiN. The refractive index of the optical waveguide $12w_1$ is higher than the refractive index of the low refractive-index layer $40b$ in the substrate 40 and the refractive index of the protection layer 50. Accordingly, light can propagate through the optical waveguide $12w_1$ by total reflection. The same applies to the optical waveguide $12w_2$. In order to increase the optical path length, the optical waveguide $12w_2$ has a helical structure. The mirror $12m_1$ may be formed of, for example, a distributed Bragg reflector. In a distributed Bragg reflector, light is reflected in accordance with Bragg reflection occurring due to a refractive-index periodical structure. The mirror $12m_1$ may be composed of metal. The same applies to the mirror $12m_2$.

In the example illustrated in FIG. 6B, the first laser resonator 12 further includes an n-doped layer $12l_1$ and a p-doped layer $12l_2$ having the first gain medium $12g$ interposed therebetween, and a supersaturated absorber $12sa$ positioned on a part of the first gain medium $12g$ and above the mirror $12m_1$. The positional relationship between the n-doped layer $12l_1$ and the p-doped layer $12l_2$ may be inverted. The first gain medium $12g$ in the first laser source 10 may be composed of, for example, a III-V semiconductor material. A III-V semiconductor material may include, for example, at least one material selected from the group consisting of ZnSe, InGaAlP, InGaAs, GaInAsP, GaInAsSb, InP, GaN, GaAs, InGaAs, AlGaAs, and AlInGaN. In the first gain medium $12g$ current-injected from electrodes (not illustrated) attached to the n-doped layer $12l_1$ and the p-doped layer $12l_2$, light is stimulated-emitted. This stimulated-emitted light is repeatedly reflected between the mirror $12m_1$ and the mirror $12m_2$ via the optical waveguide $12_{w2}$, and is amplified as a result of passing through the first gain medium $12g$ a number of times. The amplified light is turned into a mode-locked optical pulse train by the supersaturated absorber $12sa$ current-injected from the electrodes (not illustrated). Accordingly, the first optical-frequency-comb laser light is emitted from the first laser resonator 12. The first laser source 10 outputs the first portion $10l_1$ of the first optical-frequency-comb laser light toward the optical coupler 30 from the mirror $12m_2$, and outputs the second portion $10l_2$ of the first optical-frequency-comb laser light from the mirror $12m_1$ to the outside via the optical waveguide $12w_1$.

The first portion $10l_1$ of the first optical-frequency-comb laser light is input as excitation light to the second laser resonator 22 by the optical coupler 30. Consequently, the second laser source 20 outputs the second optical-frequency-comb laser light $20l$ emitted from the second laser resonator 22 to the outside from the mirror $22m_1$ via the optical waveguide $22_{w1}$.

The optical coupler 30 includes the filter 36, an optical waveguide $30_{w1}$ that connects the filter 36 and the first laser resonator 12, and an optical waveguide $30_{w2}$ that connects the filter 36 and the second laser resonator 22.

In addition to the advantages of the above embodiments, the light-emitting device 120 according to this embodiment is integrated in the substrate 40 so that the light-emitting device 120 can be reduced in size. The light-emitting device 120 may alternatively include the optical coupler 30M according to the modification of the first embodiment in place of the optical coupler 30.

In addition to the example illustrated in FIGS. 6A and 6B, a configuration similar to that of the light-emitting device 100M according to the modification of the first embodiment and a configuration similar to that of the light-emitting device 110 according to the second embodiment may also be integrated in the substrate 40.

For example, the dual optical frequency comb light-emitting device according to each embodiment of the disclosure can be used for studying the characteristics related to the optical frequency of a target object and for measuring the absolute distance to the target object.

What is claimed is:

1. A dual optical frequency comb light-emitting device comprising:
   a first optical-frequency-comb laser source that includes a first laser resonator having a first optical path length;
   a second optical-frequency-comb laser source that includes a second laser resonator having a second optical path length different from the first optical path length; and
   an optical coupler that causes a first portion of first optical-frequency-comb laser light emitted from the first laser resonator to enter the second laser resonator,
   a first output port,
   a second output port,
   wherein the first optical-frequency-comb laser source outputs a second portion of the first optical-frequency-comb laser light to an outside via the first output port, and
   wherein the second optical-frequency-comb laser source outputs second optical-frequency-comb laser light emitted from the second laser resonator to the outside via the second output port, and
   the second portion of the first optical-frequency-comb laser light output to the outside via the first output port is not input into the second laser resonator.

2. A dual optical frequency comb light-emitting device comprising:
   a first optical-frequency-comb laser source that includes a first laser resonator having a first optical path length;

a second optical-frequency-comb laser source that includes a second laser resonator having a second optical path length different from the first optical path length; and an optical coupler that causes a first portion of first optical-frequency-comb laser light emitted from the first laser resonator to enter the second laser resonator, wherein the first optical-frequency-comb laser source outputs a second portion of the first optical-frequency-comb laser light to an outside, wherein the second optical-frequency-comb laser source outputs second optical-frequency-comb laser light emitted from the second laser resonator to the outside, wherein the optical coupler includes a filter that allows light in a certain frequency band to pass through, and wherein the optical coupler causes the first portion of the first optical-frequency-comb laser light to enter the second laser resonator via the filter.

3. The dual optical frequency comb light-emitting device according to claim 2, wherein the frequency band includes a resonance frequency of the second laser resonator.

4. A dual optical frequency comb light-emitting device comprising:

a first optical-frequency-comb laser source that includes a first laser resonator having a first optical path length;

a second optical-frequency-comb laser source that includes a second laser resonator having a second optical path length different from the first optical path length; and an optical coupler that causes a first portion of first optical-frequency-comb laser light emitted from the first laser resonator to enter the second laser resonator, wherein the first optical-frequency-comb laser source outputs a second portion of the first optical-frequency-comb laser light to an outside, wherein the second optical-frequency-comb laser source outputs second optical-frequency-comb laser light emitted from the second laser resonator to the outside, and wherein the first laser resonator includes a pair of first mirrors and a first gain medium positioned between the pair of first mirrors.

5. The dual optical frequency comb light-emitting device according to claim 4, wherein the first portion of the first optical-frequency-comb laser light is output from a first one of the pair of first mirrors, and wherein the second portion of the first optical-frequency-comb laser light is output from a second one of the pair of first mirrors.

6. The dual optical frequency comb light-emitting device according to claim 5, wherein the first one of the pair of first mirrors has higher reflectivity than the second one.

7. The dual optical frequency comb light-emitting device according to claim 4, wherein the first portion and the second portion of the first optical-frequency-comb laser light are output from a first one of the pair of first mirrors.

8. The dual optical frequency comb light-emitting device according to claim 7, wherein the first one of the pair of first mirrors has lower reflectivity than a second one of the pair of first mirrors.

9. The dual optical frequency comb light-emitting device according to claim 4, wherein the first laser resonator further includes a first refractive-index modulator that modulates a refractive index of at least a part of an optical path between the pair of first mirrors.

10. The dual optical frequency comb light-emitting device according to claim 1, wherein the second laser resonator includes a pair of second mirrors and a second gain medium positioned between the pair of second mirrors.

11. The dual optical frequency comb light-emitting device according to claim 10, wherein the second laser resonator further includes a second refractive-index modulator that modulates a refractive index of at least a part of an optical path between the pair of second mirrors.

12. The dual optical frequency comb light-emitting device according to claim 1, wherein the second laser resonator includes a ring resonator composed of a nonlinear optical material.

13. The dual optical frequency comb light-emitting device according to claim 1, further comprising:

a substrate, wherein the first optical-frequency-comb laser source, the second optical-frequency-comb laser source, and the optical coupler are integrated in a surface of the substrate.

* * * * *